United States Patent [19]

Miyamoto et al.

[11] Patent Number: 4,818,966
[45] Date of Patent: Apr. 4, 1989

[54] MAGNETIC FIELD GENERATING DEVICE

[75] Inventors: Toshinobu Miyamoto; Hideya Sakurai; Hirofumi Takabayashi, All of Mishima, Japan

[73] Assignee: Sumitomo Special Metal Co., Ltd., Osaka, Japan

[21] Appl. No.: 174,172

[22] Filed: Mar. 28, 1988

[30] Foreign Application Priority Data

Mar. 27, 1987 [JP] Japan .................. 62-75689

[51] Int. Cl.$^4$ .............................. H01F 3/04
[52] U.S. Cl. ................ 335/296; 335/297; 335/304
[58] Field of Search ......... 335/296, 297, 301, 304, 335/306

[56] References Cited

U.S. PATENT DOCUMENTS

| | | | |
|---|---|---|---|
| 2,962,636 | 11/1960 | Purcell | 335/296 |
| 4,359,706 | 11/1982 | Flack | 335/306 X |
| 4,553,122 | 11/1985 | Young | 335/296 |
| 4,656,449 | 4/1987 | Mallard | 335/299 |
| 4,672,346 | 6/1987 | Miyamoto et al. | 335/296 |
| 4,707,663 | 11/1987 | Minkoff et al. | 335/306 X |

FOREIGN PATENT DOCUMENTS 61-203605  9/1986  Japan .................. 335/296

Primary Examiner—George Harris
Attorney, Agent, or Firm—Watson, Cole, Grindle & Watson

[57] ABSTRACT

A magnetic field-generating device includes a pair of permanent magnet components disposed in such a manner as to face each other with a gap formed therebetween, a yoke for magnetically coupling the pair of permanent magnet components, and pole pieces which are each fixed to a surface of a corresponding permanent magnet component that faces the gap. The magnetic field generating device is adpated to generate a magnetic field in the gap. Each of the pole pieces is made of a laminate of magnetic plates which laminated in a direction substantially perpendicular to the sides of the solid care portion.

10 Claims, 4 Drawing Sheets

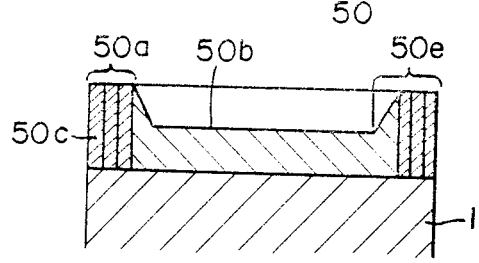
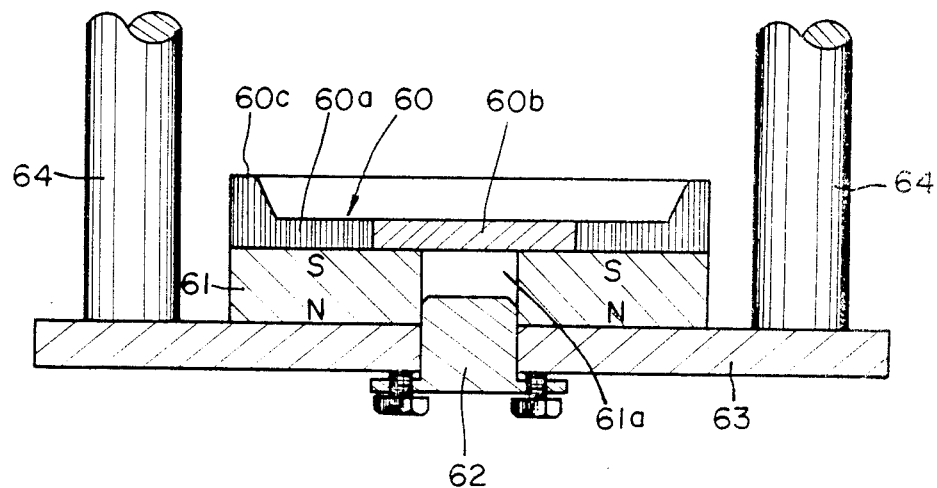

MAGNETIC FIELD GENERATING DEVICE

BACKGROUND OF THE INVENTION

1. Field of the Invention

The present invention relates to a magnetic field-generating device for use in a medical nuclear magnetic resonance tomograph (hereinafter referred to as an NMR-CT) and which employs permonent Magnets.

2. Description of the Prior Art

A conventional magnetic field-generating device for use in an NMR-CT is shown in FIG. 7. It includes a pair of permanent magnet components 1, pole pieces 2 which are respectively fixed to one end of each of the permanent magnet components 1, and a yoke 3 coupling the other ends of the permanent magnet components 1. A static magnetic field is generated within an air gap 4 formed between the pole pieces 2.

The present inventor has proposed magnetic field generating devices which enable the degree of uniformity of the magnetic field generated in the gap to be improved. These include devices wherein the pole pieces have annular protrusions at the outer peripheries thereof, and devices wherein the pole pieces have a convex protrusion at the central portion. See U.S. Pat. No. 4,672,346 and EP 0161782 A1.

In either of the the above-described magnetic field-generating devices, the pole pieces each comprise a plate-like mass formed by plaining a magnetic material such as carbon steel, i.e., the pole pieces have a solid structure.

A pole piece of this type is effective in causing the magnetic flux generated by the permanent magnetic component to act uniformly within the gap. However, the permeability in the path of the magnetic flux within such a pole piece 2 is equal in all directions, and part of the magnetic flux therefore leaks from the sides of the pole piece into the surrounding yoke.

Therefore, in order to cause the magnetic flux generated by the permanent magnet component to act effectively within the gap so as to obtain a desired magnetic field intensity, the size of the permanent magnetic component must be made large. This prevents a desired reduction in the size of the NMR-CT.

SUMMARY OF THE INVENTION

An object of the present invention is to provide a magnetic field-generating device which is capable of reducing the magnetic flux leaking from its pole pieces, thereby causing the magnetic flux to become effectively concentrated in gap so as to improve the magnetic field intensity, and which enables a reduction in the size and weight of the device and makes sure a device easy to handle and maintain.

Another object of the present invention is to provide a magnetic field-generating device which enables the degree of uniformity of the magnetic field, as well as the magnetic field intensity, to be improved.

The present inventor has mae intensive studies into reducing the size and weight of a magnetic field-generating device by reducing the magnetic flux leaking from its pole pieces and by causing the magnetic flux to be concentrated in a gap, and has reached the conclusion that the magnetic flux generated from the pole pieces can be positively concentrated in the direction of the gap so as to improve the magnetic field intensity if the peripheral portion of each the pole pieces is made of a laminate in which magnetic plates are laminated in the direction perpendicular to the side of the pole piece. The present invention is based on this conclusion.

More specifically, the present invention provides a magnetic field-generating device which includes a pair of permanent magnet components disposed in such a manner as to face each other with a gap formed therebetween, yoke magnetically coupling the pair of permanent magnet components, and pole pieces which are each fixed to a surface of a corresponding permanent magnet component that faces the gap, the magnetic field-generating device being adapted to generate a magnetic field in the gap, which is characterized in that at least the peripheral portion of each of the pole pieces is made of a laminate in which magnetic plates are laminated in the direction substantially perpendicular to the sides of the pole piece.

Since the peripheral portion of each of the pole pieces is a laminate of magnetic plates, substantially non-magnetic portions having a large magnetic reluctance are formed between the laminated magnetic plates. It is difficult for the magnetic flux generated by the permanent magnetic components to pass through the non-magnetic portions which have a large magnetic reluctance, but it is easy for it to pass through the portions of the magnetic plates which have a small magnetic reluctance. As a result, leakage of magnetic flux from the sides of each of the pole pieces can be reduced, thereby improving the magnetic field intensity within the gap. This ensures a structure having an excellent magnetic efficiency, and provides a magnetic field-generating device which is small and light in weight.

BRIEF DESCRIPTION OF THE DRAWINGS

FIG. 1b is a transverse sectional view of the magnetic field-generating device of FIG. 1a;

FIG. 5 is a longitudinal sectional view showing still another pole piece structure of a magnetic field-generating device according to the present invention;

FIG. 6 is a longitudinal sectional view showing an example of application of the present invention as a magnetic field-generating deice for use in an NMR-CT;

DESCRIPTION OF THE PREFERRED EMBODIMENTS

Figure 1A:
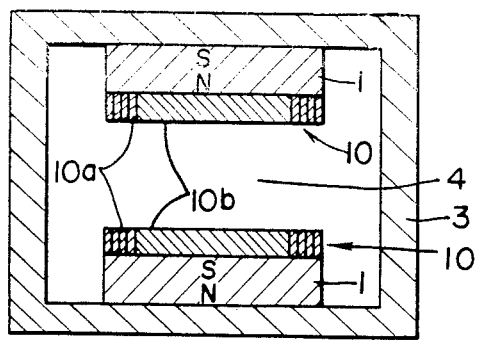
FIG. 1a is a schematic longitudinal sectional view of a magnetic field-generating device of the present invention.

The magnetic circuit of the present invention may have any structure so long as it is constructed such that a pair of permanent magnetic components are magnetically coupled by a yoke in such a manner that they face each other with a gap formed therebetween, and that a pole piece is fixed to a surface of a corresponding permanent magnet component that faces a gap. The structure of a laminate of magnetic plates as well as the position thereof are suitably selected in accordance with the magnetic characteristics and shape and dimensions of the permanent magnet, the shape and dimensions of the yoke, or the size of the gap.

Permanent magnets that can be used for such a magnetic circuit include ferrite magnets, Alnico magnets, and rare earth cobalt magnets. However, use of an Fe-B-R permanent magnet, which the present inventor proposed in the specification of Japanese Patent Laid-Open No. 145072/1982, is effective in reducing the size of the device. The Fe-B-R permanent magnet uses as R a light rate earth element which is an abundant natural resource such as Nd or Pr, and is mainly made of B and Fe. It exhibits an extremely high energy product of 30 MGOe or more.

The pole pieces may have any known shape, such as a disk-like or rectangular shape. In particular, each pole piece may have a trapezoidal form in which the end surface thereof which faces the gap is smaller than the end surface thereof which abuts against the corresponding magnet component so that the concentration of the magnetic flux within the gap is facilitated. Alternatively, it may have an annular protrusion around a peripheral portion of the end surface thereof which faces the gap, or a convex protrusion at a central portion thereof.

At least the peripheral portion of each of the pole pieces should be a laminate of magnetic plates so as to enable a reduction in the magnetic flux leakage from the sides of the pole piece. However, the greater part of the pole piece may also be a laminate.

The laminate may have any structure so long as it is formed of magnetic plates laminated in a direction substantially perpendicular to the sides of the pole pieces, which can have any of various shapes. For example, a magnetic plate strip may be wound around the periphery of a disk-shaped pole piece so as to form the laminate. Alternatively, the laminate may be formed of a plurality of annular magnetic plates whose diameters are sequentially reduced by a value equivalent to the thickness of the plate, the annular magnetic plates being fitted into one another so as to form a laminate unit.

It a non-magnetic material such as a resin or paper is interposed between the magnetic sheets as they are laminated, the magnetic field intensity can be further improved.

If only the peripheral portion of the pole piece is formed by the laminate of magnetic plates, it is not necessary to use the same material for the magnetic plates employed to form the laminate and for the solid portion which constitutes the central portion of the pole piece. The material is suitably selected in accordance with the structure or shape thereof. For example, only the magnetic plates used for the laminate may be made of silicon steel sheet.

Figure 1B:
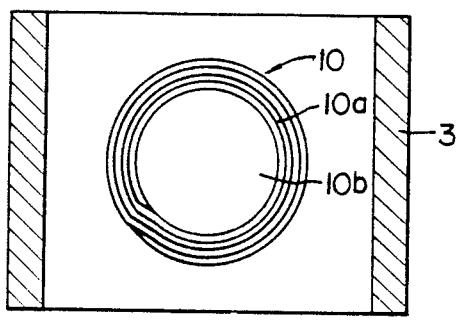
Figure 1C:
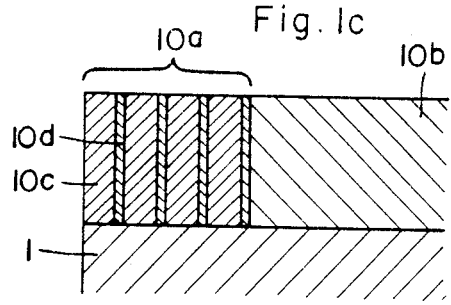
FIG. 1c is an enlarged longitudinal sectional view showing a laminate of magnetic plates.
Figure 2:
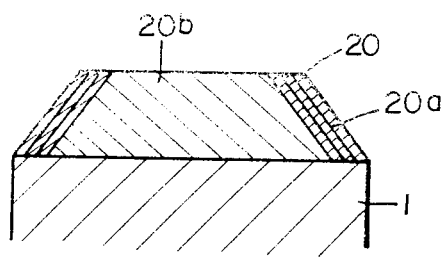
FIGS. 2 and 3 are longitudinal sectional views showing other pole piece structures of a magnetic field-generating device according to the present invention.
Figure 3:
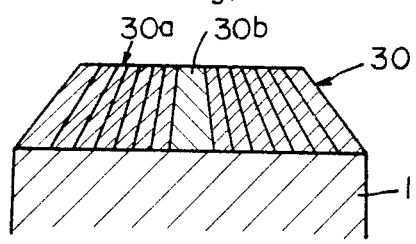
Figure 4:
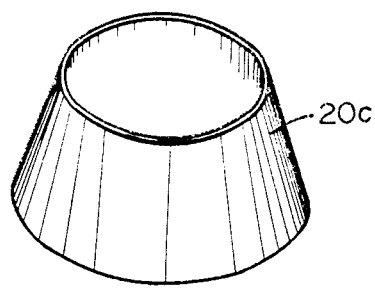
FIG. 4 is a perspective view of an annular magnetic plate which forms part of the laminate of the pole piece structure in FIG. 2.

FIGS. 1a–1c schematically show a magnetic field-generating device according to one embodiment to the present invention, FIG. 1b showing a transverse section thereof, and FIG. 1c showing a detailed longitudinal sectional view and depicting the laminate of magnetic plates. FIGS. 2, 3, and 5 are longitudinal sectional views showing other example of the pole pice structure of the magnetic field-generating device according to the present invention. FIG. 4 is a perspective view of an annular magnetic plate which can constitute part of the laminate.

As shown in FIGS. 1a–1c, the magnetic field-generating device of the present invention includes a pair of permanent magnet components 1, pole pieces 10, each of which is fixed to one end of one of the permanent magnetic components 1, and a yoke 3 for coupling the other ends of the permanent magnet components 1 in such a manner that a gap 4 is formed between the pole pieces 10. This structure serves to generate a static magnetic field within the gap.

Each of the pole pieces 10 has a disk-like shape, and is comprised of a laminate 10a and a solid portion 10b, the laminate 10a forming a peripheral portion of the disk and the solid portion 10b constituting a core.

As shown in FIGS. 1b and 1c, the laminate 10a is formed in a direction perpendicular to the sides of the solid portion 10b of the pole pieces be winding a magnetic plate strip 10c several hundred times around the periphery of the disk-like solid portion 10b a sheet of insulting paper 10d being interposed between the layers of the magnetic plate strip.

Because of the presence of the insulating paper 10d, which has a large magnetic reluctance, the amount of magnetic flux passing through each magnetic plate 10c of laminate 10a decreases in the radial direction of the pole piece 10, i.e., in the lateral direction as viewed in FIG. 1, and is directed into the gap, i.e., in the longitudinal direction as viewed in FIG. 1.

Thus, with the pole piece 10 having this laminate 10a of the magnetic plates 10c around its peripheral portion, most of the magnetic flux generated by the permanent magnet component 1 does not leak from the sides of the pole piece, but is concentrated in the direction of the gap 4, thereby improving the magnetic field intensity within the gap 4.

In order to facilitate the concentration of the generated magnetic flux within the gap, pole pieces 20 and 30 shown in FIGS. 2 and 3 have a trapezoidal shape, and the end surface of each of them that faces the gap is made smaller than the end surface thereof that abuts against the associated magnetic component. In the pole piece 20 shown in FIG. 2, only the peripheral portion of the pole piece 20 is made of a laminate 20a, whereas a laminate 30a forms the greater part of the pole piece 30 shown in FIG. 3.

The laminate 20a shown in FIG. 2 is easily formed by, for example, preparing a predetermined number of truncated conical magnetic plates 20c such as those shown in FIG. 4 whose diameters are increased by a value equivalent to the thickness and by fitting them sequentially to the outer periphery of a solid portion 20b.

The pole pice 30 shown in FIG. 3, i.e., the laminate 30a formed at the outer periphery of a solid portion 30b may be formed in the manner shown in FIG. 2. However, the plurality of magnetic plates 20c used to form the laminate 30a are prepared such that the thickness of each of the magnetic plates 20c is decreased as it gets close to the head portion thereof, and that the angle of the laminating surface of the magnetic plate 20c which is located at the innermost side is the closest to perpendicular. In this way, the concentration of the magnetic flux within the gap is further improved.

FIG. 5 shows still another example of the structure of the pole piece. In a pole piece 50, the periphery of a surface of a solid portion 50b that faces the gap 4 is provided with an annular protrusion 50e having a trapezoidal cross section and whose inner diameter is inclined in such a manner that it expands upward. A laminate 50a of magnetic plates 50c is formed in a direction perpendicular to the sides of the solid portion 50b containing the inclined portion of the annular protrusion 50e in such a manner that it forms part of the annular protrusion 50e.

Further, the central portion of a portion of the solid portion 50b which is located inside the annular protrusion 50e may be provided with a protrusion having an oblate trapezoidal cross-section for the purpose of improving the degree of magnetic field uniformity within the gap.

If any of the pole pieces 20, 30, and 50 shown in FIGS. 2, 3, and 5 is used, the greater part of the magnetic flux generated by each of the permanent magnetic components 1 is concentrated in the direction of the gap without leaking from the sides of each of the pole pieces, thereby improving the magnetic field intensity within the gap 4.

FIG. 6 shows an example of application of the present invention as a magnetic field-generating device for use in an NMR-CT.

Disk-shaped pole pieces 60 of the device are each comprised of a laminate 60a constituting the main feature of the present invention and a solid portion 60b. Each of the pole pieces 60 has an annular protrusion 60c at the peripheral portion thereof. Permanent magnet components 61 each have a through hole 61a at a central portion. A mangnetic field finely adjusting magnetic material 62 is inserted into the through-hole 61a in such a manner that the amount of insertion is adjustable so as to enable the fine adjustment of the magnetic field intensity within the gap 65. This magnetic field-generating device also includes plate-like yokes 63 (only the lower plate-like yoke being shown in the drawing), and column-like yokes 64 for disposing the pair of plate-like yokes 63 with a gap having a predetermined size formed therebetween.

With the thus-arranged device, the intensity and the degree of uniformity of the magnetic field within the gap 65 can be improved by suitably selecting the outer diameter of the solid portion 60b (the inner diameter of the laminate 60a), the height of the annular protrusion 60c, the diameter of the through-hole 61a formed in the permanent magnet component, and the amount of insertion of the magnetic field finely adjusting magnetic material. The intensity and the degree of uniformity of the magnetic file can further be improved to be superior to the prior at by selecting the ratio of the outer diameter of the solid portion and the outer diameter of the pole pieces, the ratio of which being preferably in a range of 0.2 to 0.95.

EXAMPLE 1

A magnetic field-generating device was constructed in the same manner as the magnetic field-generating device shown in FIGS. 1a–1c by employing Fe-B-R permanent magnets having a (BH) maximum of 35 MGOe, and pole pieces shown in FIG. 5, each of the pole pieces being comprised of a solid portion with an annular protrusion formed at the peripheral portion thereof and a laminate of magnetic plates provided around the outer periphery of the annular protrusion. In this device, each of the pole pieces had a diameter of 850 mm, the solid portion of each of the pole pieces had a diameter of 600 mm, and the distance between the pair of pole pieces was set to 450 mm. The magnetic field intensity at the central portion of the gap of this device was measured.

The laminate forming the peripheral portion of each of the pole pieces is formed of a magnetic plate made of a silicon steel sheet and a sheet of insulating paper. When the rate of occupation of the magnetic plate in the laminate was 90%, a magnetic field intensity of 1616 G was measured. With a rate of occupation of magnetic plate of 70%, the magnetic field intensity was at 1734 G. Even with a rate of occupation of magnetic plate of about 30%, the magnetic field intensity was at more than 1600 G.

Figure 7:
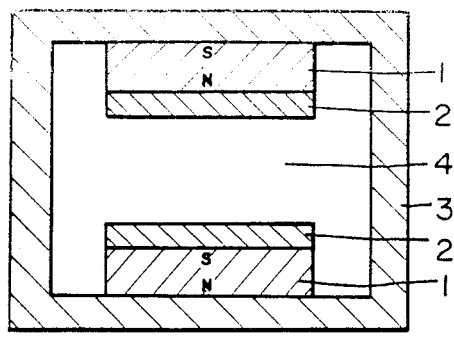
FIG. 7 is a longitudinal sectional view of a known magnetic field-generating device.

When the magnetic field intensity at the central portion of the gap was measured for comparison in a magnetic field-generating device constructed under the same conditions with the exception that each of the pole pieces was made of a solid pure iron, as shown in FIG. 7, it was 1587 G.

The weight of the permanent magnetic required to generate the same magnetic field intensity as measured was examined on the basis of the results of the measurement. For the magnetic field generating device of the comparison example, it became clear that 8 tons of permanent magnetic would be necessary, whereas in a case of the magnetic field generating device according to the present invention, it was found that the weight could be reduced by 15% to 20%.

EXAMPLE 2

Figure 8:
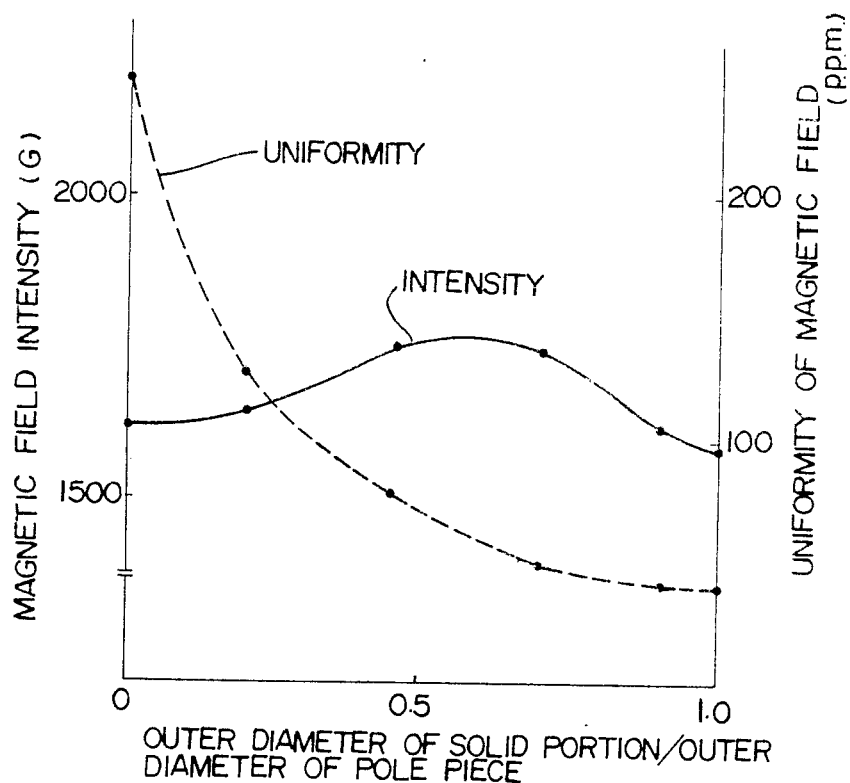
FIG. 8 is a graph showing the relationship between the dimension of a solid portion and the intensity and degree of uniformity of the magnetic field.

In a magnetic field-generating device constructed in the same manner as that shown in FIG. 6 and employing the Fe-B-R permanent magnets having a (BH) maximum of 35 MGOe, variations in the intensity and degree of uniformity of the magnetic field within the gap were measured as the dimension of the outer diameter of the solid portion 60b, i.e., the dimension of the inner diameter of the laminate 60a (which is formed by laminating the magnetic plates made of silicon steel sheet and having a thickness of 0.35 mm) changed. FIG. 8 shows the results of the measurement.

At this time, the outer diameter of each of the pole pieces 60 was constant at 1160 mm. The gap between the pair of pole pieces was set to 520 mm. and a rate of occupation of the magnetic plate of the laminate (60a) was 70%. For the comparison, a magnetic field-generating device was assembled under the same conditions as those of this device, as shown in FIG. 7, with the exception that each of the pole pieces was made of a solid pure iron, and the same measurement was conducted. The degree of uniformity represents the values measured in a spherial space having a radium of 150 mm with the center of the gap being the center of the space.

It can be seen from the graph of FIG. 8 that the magnetic field intensity within the gap improves in the magnetic field generating device according to the present invention when compared with a case where the pole pieces which are each formed only of the solid portion (a solid structure) are used. It can also be clear that the same or higher degree of uniformity of the magnetic field was ensured when the ratio of the outer diameter of the solid portion to the outer diameter of the pole piece is between 0.2 and 0.95.

What is claimed is:

1. In a magnetic field-generating device which includes a pair of permanent magnet components disposed in such a manner as to face each other with a gap formed therebetween, a yoke for magnetically coupling said pair of permanent magnet components, and pole pieces which are each fixed at one end surface to a surface of an associated permanent magnet component, an opposite end surface thereof facing said gap, said magnetic field-generating device being adapted to generate a magnetic field in said gap, the improvement wherein each pole piece is composed of a solid core portion which has outer sides, and an outer portion formed of a laminate of magnetic sheets and non-magnetic sheets positioned around said solid core portion, said laminate being laminated in a direction substantially perpendicular to the outer sides of said solid core portion.

2. A magnetic field-generating device according to claim 1, wherein each said pole piece has a disk-like shape.

3. A magnetic field-generating device according to claim 1, wherein each said pole piece has a disklike shape, and wherein the peripheral portion of the end surface of said pole piece that faces said gap is provided with an annular protrusion.

4. A magnetic field-generating device according to claim 1, wherein each said pole piece has a disklike shape, wherein the peripheral portion of the end surface of each said pole piece that faces said gap is provided with an annular protrusion, and wherein a central portion of the end surface of each said pole piece that faces said gap is provided with a convex protrusion.

5. A magnetic field-generating device according to claim 1, wherein the ratio of the outer diameter $D_B$ of each said solid core portion to the outer diameter $D_p$ of each said pole pieces, $D_B/D_p$, is between 0.2 and 0.95.

6. A magnetic field-generating device according to claim 1, wherein each of said pole pieces has a trapezoidal cross-section, such that the end surface thereof that faces said gap is smaller than the end surface thereof that abuts against the associated permanent magnetic component.

7. A magnetic field-generating device according to claim 1, wherein each of said permanent magnet components is an annular body having a through-hole at the center thereof.

8. A magnetic field-generating device according to claim 1, wherein the solid core portion of each pole piece is disc-shaped, and wherein said laminate includes a magnetic plate strip wound in layers around said disc-shaped solid core portion.

9. A magnetic field-generating device according to claim 8, including a non-magnetic sheet interposed between said layers of magnetic plate strip.

10. A magnetic field-generating device according to claim 9, wherein said magnetic plate strip constitutes at least 30% of said laminate.

* * * * *